United States Patent
Chen et al.

(10) Patent No.: US 8,236,583 B2
(45) Date of Patent: Aug. 7, 2012

(54) METHOD OF SEPARATING LIGHT-EMITTING DIODE FROM A GROWTH SUBSTRATE

(75) Inventors: Ding-Yuan Chen, Taichung (TW); Hung-Ta Lin, Hsin-Chu (TW); Chen-Hua Yu, Hsin-Chu (TW); Wen-Chih Chiou, Miaoli (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 409 days.

(21) Appl. No.: 12/554,578

(22) Filed: Sep. 4, 2009

(65) Prior Publication Data
US 2010/0062551 A1    Mar. 11, 2010

Related U.S. Application Data

(60) Provisional application No. 61/095,773, filed on Sep. 10, 2008, provisional application No. 61/147,677, filed on Jan. 27, 2009.

(51) Int. Cl.
*H01L 21/00* (2006.01)
(52) U.S. Cl. .................................. 438/23; 257/E27.12
(58) Field of Classification Search ................ 438/23; 257/E27.12
See application file for complete search history.

(56) References Cited

U.S. PATENT DOCUMENTS

| | | | |
|---|---|---|---|
| 6,071,795 A | | 6/2000 | Cheung et al. |
| 6,559,075 B1 | | 5/2003 | Kelly et al. |
| 2003/0045017 A1* | | 3/2003 | Hiramatsu et al. ............. 438/46 |
| 2004/0087051 A1* | | 5/2004 | Furuya et al. .................. 438/47 |
| 2006/0091409 A1* | | 5/2006 | Epler et al. ...................... 257/95 |

FOREIGN PATENT DOCUMENTS

JP    07-235690    9/1995

OTHER PUBLICATIONS

Kidoguchi, I., et al. "Improvement of Crystalline Quality in GaN Films by Air-Bridged Lateral Epitaxial Growth," The Japan Society of Applied Physics, May 15, 2000, vol. 39, No. 5B, Part 2, pp. L453-L456.

* cited by examiner

*Primary Examiner* — Lex Malsawma
(74) *Attorney, Agent, or Firm* — Haynes and Boone, LLP

(57) ABSTRACT

A method of forming a light-emitting diode (LED) device and separating the LED device from a growth substrate is provided. The LED device is formed by forming an LED structure over a growth substrate. The method includes forming and patterning a mask layer on the growth substrate. A first contact layer is formed over the patterned mask layer with an air bridge between the first contact layer and the patterned mask layer. The first contact layer may be a contact layer of the LED structure. After the formation of the LED structure, the growth substrate is detached from the LED structure along the air bridge.

21 Claims, 6 Drawing Sheets

METHOD OF SEPARATING LIGHT-EMITTING DIODE FROM A GROWTH SUBSTRATE

This application claims the benefit of U.S. Provisional Application No. 61/095,773, filed on Sep. 10, 2008, entitled Method of Separating Light-Emitting Diode from a Growth Substrate, and U.S. Provisional Application No. 61/147,677, filed on Jan. 27, 2009, entitled Method of Separating Light-Emitting Diode from a Growth Substrate which applications are hereby incorporated herein by reference.

TECHNICAL FIELD

This invention relates generally to semiconductor device manufacturing processes and, more particularly, to forming a light-emitting diode and separating a light-emitting diode structure from a growth substrate.

BACKGROUND

Compound semiconductor devices are widely used for optoelectronic applications. For example, compound semiconductors composed of materials from group III-V are best suitable for light-emitting diodes (LEDs). LEDs are manufactured by forming active regions on a substrate and by depositing various conductive and semiconductive layers on the substrate. The radiative recombination of electron-hole pairs can be used for the generation of electromagnetic radiation (e.g., light) by the electric current in a p-n junction. In a forward-biased p-n junction fabricated from a direct band gap material, such as gallium arsenide (GaAs) or gallium nitride (GaN), the recombination of the electron-hole pairs injected into the depletion region causes the emission of electromagnetic radiation. The electromagnetic radiation may be in the visible range or may be in a non-visible range. Different colors of LEDs may be created by using compound materials with different band gaps.

Crystalline compound semiconductor materials, such as GaN, are typically formed by epitaxially growing a compound semiconductor layer upon a crystalline substrate of another material, such as a sapphire substrate that has a matching crystallographic plane and is more easily formed. The GaN layer thus formed are processed into electronic or optoelectronic devices, such as LEDs, based upon the properties of GaN. The compound semiconductor devices are then detached from their growth substrate and reattached to other semiconductor or non-semiconductor substrates to be integrated with other electronic components for the intended applications.

Various techniques exist in separating a compound semiconductor layer from a growth substrate. In one attempt, an epitaxial sacrificial layer is first grown on the substrate. The compound semiconductor layer is then epitaxially grown on the sacrificial layer. After the compound semiconductor layer is processed with the intended devices, it is separated from its growth substrate by a wet etching process, which selectively etches away the sacrificial layer, thereby lifting off the compound semiconductor layer. The free-standing compound semiconductor film may be then bonded to other substrates. The compound thin film may be further processed to integrate the functionalities of the compound semiconductor devices and of devices in the other substrate material.

The above existing separating process relies upon a liquid etchant dissolving from the sides of a very thin sacrificial layer between the growth substrate and epitaxially formed compound semiconductor film. The separating process can be very time-consuming, especially for separating large area films, and are economically unfavorable for manufacturing processes of large scale.

In another attempt, an optical process is deployed in lifting off compound films from a growth substrate. As an example, a GaN film is epitaxially grown on a sapphire substrate. The resultant structure is then irradiated from the sapphire side with an intense laser beam. This wavelength of the laser is within the sapphire bandgap so that the radiation passes through it, but the irradiation wavelength is somewhat outside of the absorption edge of GaN. As a result, a significant portion of the laser energy is absorbed in the GaN next to the interface. The intense heating of the GaN separates the gallium from gaseous nitrogen, thereby separating the GaN thin film from the sapphire substrate.

The process, however, suffers various difficulties. As an example, the high energy laser radiation may blow away the overlying GaN film, and fracturing of the GaN film often occurs. Moreover, the area of the high-energy laser beams is limited, which makes separating large area films difficult.

SUMMARY OF THE INVENTION

These and other problems are generally reduced, solved or circumvented, and technical advantages are generally achieved, by embodiments of the present invention, which provides a method of forming a light-emitting diode (LED) device and separating the LED device from a growth substrate.

In accordance with one aspect of the present invention, a method of forming a light-emitting diode (LED) comprises providing a first substrate, and forming and patterning a mask layer on the substrate, thereby creating a patterned mask layer. The method also comprises forming a first contact layer over the patterned mask layer with an air gap between the first contact layer and the patterned mask layer. The method further comprises forming an LED structure wherein the first contact layer is a contact layer of the LED structure, and forming a second substrate on the LED structure wherein the second substrate is conductive. The method even further comprises separating the LED structure from the first substrate.

In accordance with another aspect of the present invention, a method of forming an LED device comprises providing a first substrate, and forming and patterning a mask layer on a first side of the substrate, thereby creating a patterned mask layer. The method also comprises forming an LED structure over the patterned mask layer with an air bridge between the LED structure and the patterned mask layer, forming a second substrate over the LED structure on an opposing side of the LED structure from the first substrate, and detaching the first substrate from the LED structure through a wet etch process.

In accordance with yet another aspect of the present invention, a method of forming an LED device comprises forming and patterning a mask layer on a growth substrate, thereby creating a patterned mask layer. The method also comprises forming seed regions in one or more openings in the patterned mask layer, the seed regions protruding from the patterned mask layer. The method further comprises laterally growing from the seed regions until a continuous, first contact layer is formed over the patterned mask layer with an air bridge between the first contact layer and the patterned mask layer, forming an LED structure wherein the first contact layer is a contact layer of the LED structure, and separating the LED structure from the growth substrate at the air bridge.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming GaN layers for light-emitting diodes (LEDs) and separating the LEDs from a growth substrate is provided. The intermediate stages of manufacturing preferred embodiments of the present invention are illustrated. It should be understood that the shown steps illustrate the inventive aspects of the invention, but other processes may be performed. Throughout the various views and illustrative embodiments of the present invention, like reference numbers are used to designate like elements.

Figure 1:
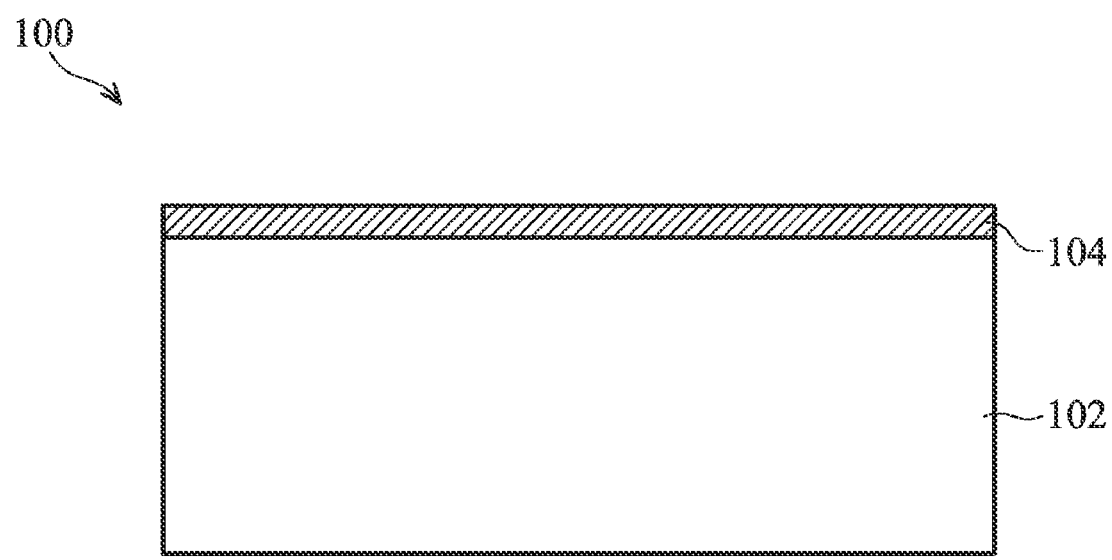
FIGS. 1-6 illustrate various intermediate process steps of manufacturing a light-emitting diode device in accordance with an embodiment of the present invention.

FIGS. 1-6 illustrate various intermediate process steps of forming an LED on a substrate in accordance with an embodiment of the present invention. Referring first to FIG. 1, a wafer 100 is shown including a substrate 102 with an overlying mask layer 104. The substrate 102 is preferably a bulk semiconductor substrate, doped or undoped, preferably having a (100) surface orientation. It should be noted that while embodiments of the present invention are described in the context of using a bulk silicon substrate, other substrates may be used. For example, silicon-on-insulator (SOI) substrates, sapphire substrates, SiC substrates, and the like may also be used. Embodiments of the present invention, however, may be particularly suited to silicon substrates due to the low cost. Furthermore, while a substrate having a (100) surface orientation is preferred, substrates having a different surface orientation, such as (110) or (111) surface orientations, may also be used.

The mask layer 104 is preferably a hard mask comprising one or more dielectric layers. For example, silicon nitride (SiNx) formed through a process such as chemical vapor deposition (CVD) may be used. In another embodiment, mask layer 104 may be a silicon dioxide layer formed by, for example, thermal oxidation or by chemical vapor deposition (CVD) techniques using tetra-ethyl-ortho-silicate (TEOS) and oxygen as precursor. Alternatively, other dielectric materials, such as silicon oxynitride, or the like may be formed through a process such as CVD for forming mask layer 104. A multi-layer hard mask, such as layers of silicon dioxide and silicon nitride, may also be used. The mask layer 104 preferably has a thickness of about 50 Å to about 200 Å.

Figure 2A:
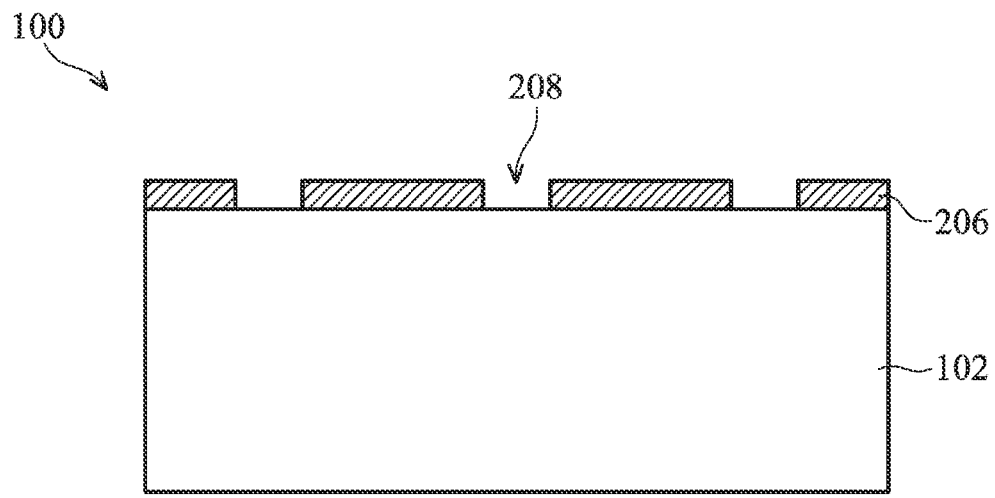
Figure 2B:
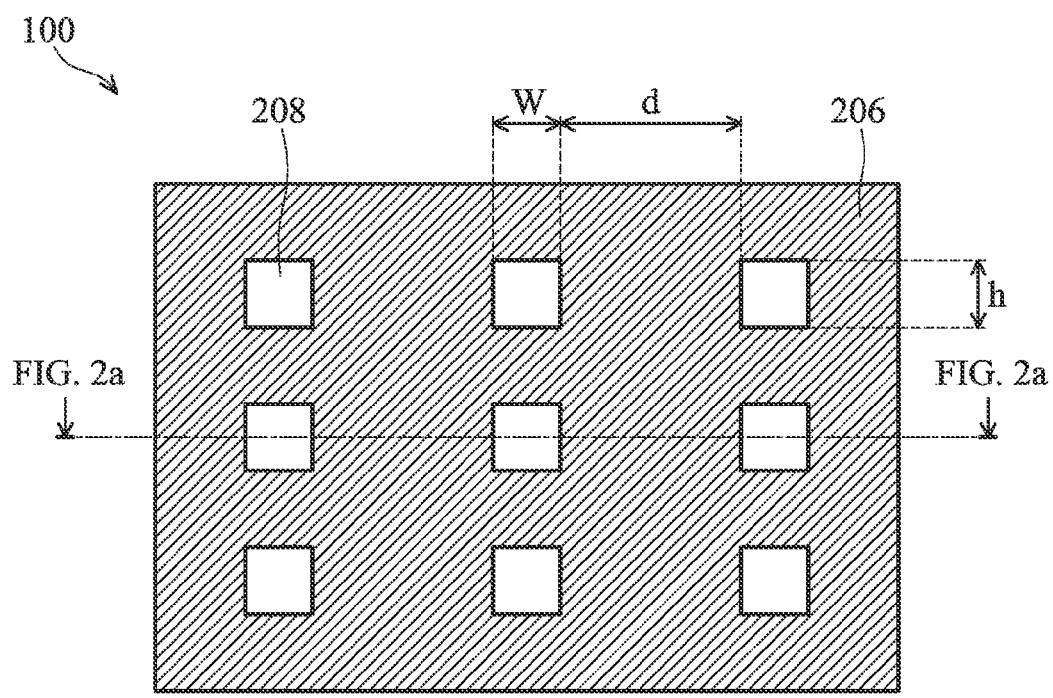

As illustrated in FIGS. 2a and 2b, the mask layer 104 (see FIG. 1) is subsequently patterned to form a patterned mask 206 in accordance with an embodiment of the present invention. In an embodiment, the mask layer 104 is patterned using photolithography techniques known in the art. Generally, photolithography techniques involve depositing a photoresist material and irradiating the photoresist material in accordance with a pattern. Thereafter, the photoresist material is developed to remove a portion of the photoresist material. An etching process is subsequently performed on wafer 100 creating openings 208 in the patterned mask 206. The remaining photoresist material protects the underlying mask layer material during the etching process.

Figure 2C:
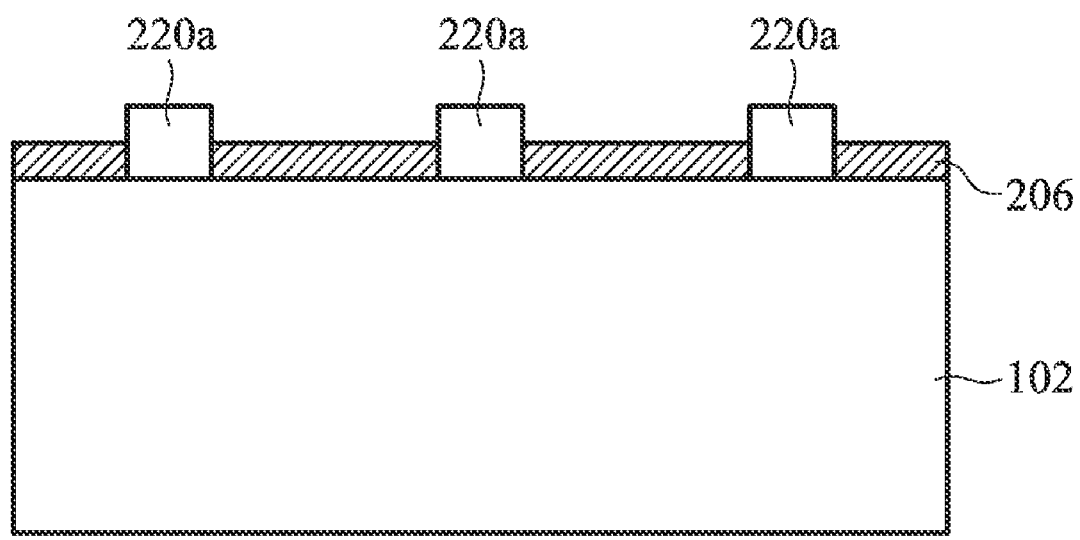

After the etching process, a matrix of openings 208 are created in the patterned mask 206, exposing the underlying substrate 102. Each opening preferably has a height width w of about 2 µm to about 10 µm, as shown in FIG. 2b. The spacing between adjacent openings 208 has a distance of about 5 µm to about 10 µm. It should be noted that the embodiment illustrated in FIG. 2b illustrates square openings for illustrative purposes only. Other embodiments may use any suitable shape, including rectangles, stripes, circles, ovals, triangles, and/or the like. Furthermore, other embodiments may not be arranged in a matrix formed by rows and columns, but rather may include openings in a patterned, staggered, or the like arrangement. A, preferably GaN, seed 220a is then formed in each of the openings 208, as shown in FIG. 2c.

Figure 3:
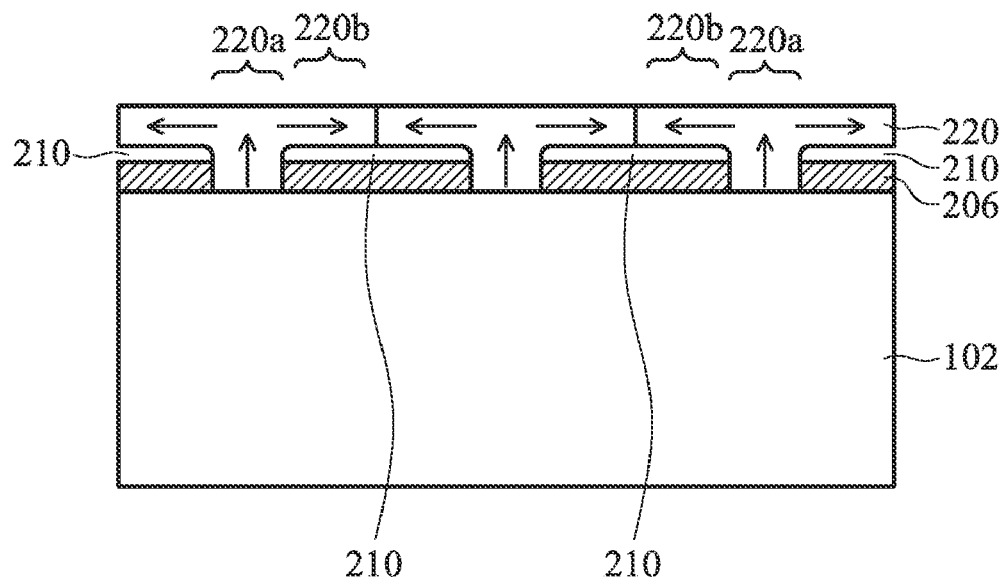

FIG. 3 illustrates forming a first contact layer 220 formed in accordance with an embodiment of the present invention. In an embodiment, the first contact layer 220 may be formed of a group III-nitride (or other group V element), e.g. GaN, and used as a first contact layer of an LED structure as will be discussed in detail below. In an embodiment, the first contact layer 220 includes raised regions (also sometimes referred to as seed regions or seeds) 220a formed in the openings 208 and lateral regions 220b grown over the patterned mask 206. The seed regions 220a are formed in the openings 208 vertically (vertical arrows in FIG. 3), protruding from the patterned mask 206. The protruding portions of the seed regions 220a exhibit crystalline facets on their sidewalls. After forming seed regions 220a, the lateral regions 220b are formed by a lateral epitaxial growth of GaN from the newly shaped crystalline facets on the sidewalls of GaN seed regions, extending horizontally (lateral arrows in FIG. 3) over the patterned mask 206. The lateral growth of GaN 220b (also sometimes referred to as lateral regions) proceeds over patterned mask 206 to form the first contact layer 220 in a continuous form as shown. As a result of the lateral growth process, air bridges 210 are formed between GaN first contact layer 220 and the patterned mask 206. In an embodiment, the first contact layer 220 above the patterned mask 206 preferably has a thickness of about 500 nm to about 3000 nm, and air bridge 210 thus formed has a depth of about 0.3 µm to about 1.0 µm.

In an embodiment where GaN is used to form the first contact layer 220, wafer 100 with the patterned mask 206 may be first processed in a selective metal organic chemical vapor deposition (MOCVD) process using trimethylgallium (TMG) and $NH_3$ as the Ga and N sources to form the GaN seed regions 220a. After the formation of GaN seed regions 220a, wafers are continuously processed to form the lateral regions 220b in the same MOCVD processing reactor. In another embodiment, forming GaN seed regions 220a and lateral regions 220b of the first contact layer 220 are performed in separate MOCVD processing chambers. In an embodiment, high temperature MOCVD process is used to form first contact layer 220 between about 700° C. and about 1100° C. Alternatively, first contact layer may be formed in a low-temperature MOCVD process, for example, between about 300° C. and about 700° C. Other processes, such as a remote plasma-enhanced chemical vapor deposition (RRCVD), molecular-beam epitaxy (MBE), metal organic vapor phase epitaxy (MOVPE), hydride vapor phase epitaxy (HYPE), liquid phase epitaxy (LPE), or the like, may also be used to form the first contact layer 220.

In an embodiment, the first contact layer 220 is doped with n-type impurity. In other embodiments, the first contact layer 220 may be doped with a p-type impurity or substantially un-doped. Alternatively, the first contact layer 220 may also include other group-III nitrides, such as InN, AlN, $In_xGa_{(1-x)}N$, $Al_xGa_{(1-x)}N$, $Al_xIn_yGa_{(1-x-y)}N$, or the like, formed by applicable deposition techniques in a similar process described above, which creates the air bridges 210 between the first contact layer 220 and the patterned mask 206. Other materials, including other group V elements instead of nitride, may be also used.

Figure 4:
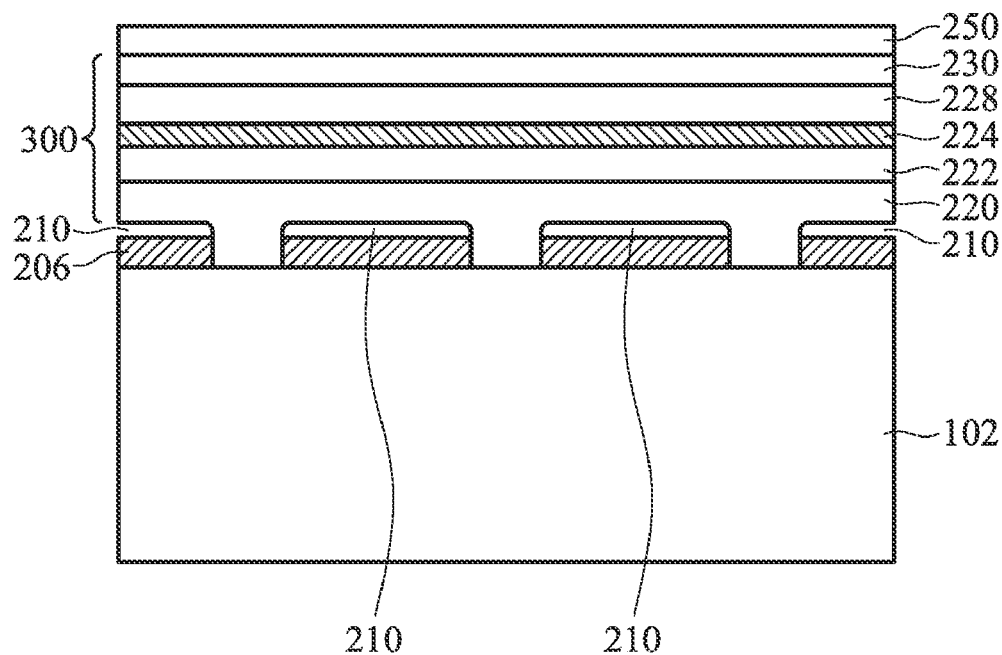

FIG. 4 illustrates completing an LED structure 300 over the substrate 102 in which the first contact layer 220 acts as a contact layer for an LED in accordance with an embodiment of the present invention. The LED structure 300 may include the first contact layer 220 formed with method described above, an optional first cladding layer 222, light emitting layer 224, an optional second cladding layer 228, and a second contact layer 230.

The optional first cladding layer 222 is formed over the first contact layer 220. Similar to the first contact layer 220, the first cladding layer 222 may be formed of a group III-N compound (or other group V element). In an exemplary embodiment, the first cladding layer 222 comprises a group III-N compound having an n-type conductivity (e.g., n-AlGaN). The formation methods of the first cladding layer 222 may be essentially the same as the method for forming first contact layer 220.

The light-emitting layer (also sometimes referred to as an active layer) 224 is formed on first cladding layer 222. The light-emitting layer 224 may include a homojunction, heterojunction, single-quantum well (SQW), multiple-quantum well (MQW), or the like structure. In an exemplary embodiment, the light-emitting layer 224 comprises undoped gallium indium nitride ($Ga_xIn_yN_{(1-x-y)}$). In alternative embodiments, light-emitting layer 224 includes other commonly used materials such as $Al_xIn_yGa_{(1-x-y)}N$. In yet other embodiments, light-emitting layer 224 may be a multiple quantum well including multiple well layers (such as InGaN) and barrier layers (such as GaN) allocated in an alternating pattern. Again, the formation methods include MOCVD, MBE, HVPE, LPE, or other applicable CVD methods. The total thickness of the light-emitting layer 224 is preferably between about 5 nm and about 200 nm.

The optional second cladding layer 228 is formed on light-emitting layer 224. In an embodiment, the second cladding layer 228 comprises a material similar to that of first cladding layer 222, such as AlGaN, except the second cladding layer 228 may be doped to p-type. The formation method of the second cladding layer 228 may be essentially the same as the method for forming the first cladding layer 222, except having an opposite type of conductivity.

The second contact layer 230 is formed on the second cladding layer 228. The second contact layer 230 may be formed of essentially the same or different materials, and using similar methods, as the formation of first contact layer 220, except the conductivity type of the second contact layer 230 is opposite to that of the first contact layer 220.

Also shown in FIG. 4 is a reflective layer 250 formed over the top of the group III-V LED structure 300. The reflective layer 250 acts to reflect light emitted from the light-emitting layer 224 toward and through the second contact layer 230 back toward the first contact layer 220, which will act as the light-emitting surface of the LED device as discussed below. The reflective layer 250 may comprise a single layer of reflective metal, e.g., Al, Ag, or the like. Thus, in one embodiment, reflective layer 250 also acts as an electrode providing electrical contact to a p-type second contact layer 230. The reflective layer 250 may comprise a multiple layer structure, such as a distributed Bragg reflector, an omni-directional reflector, or the like. The reflective layer 250 preferably has a thickness from about 50 Å to about 500 Å. In other embodiments in which the second contact layer 230 is highly reflective, the reflective layer 250 may not be necessary.

Figure 5:
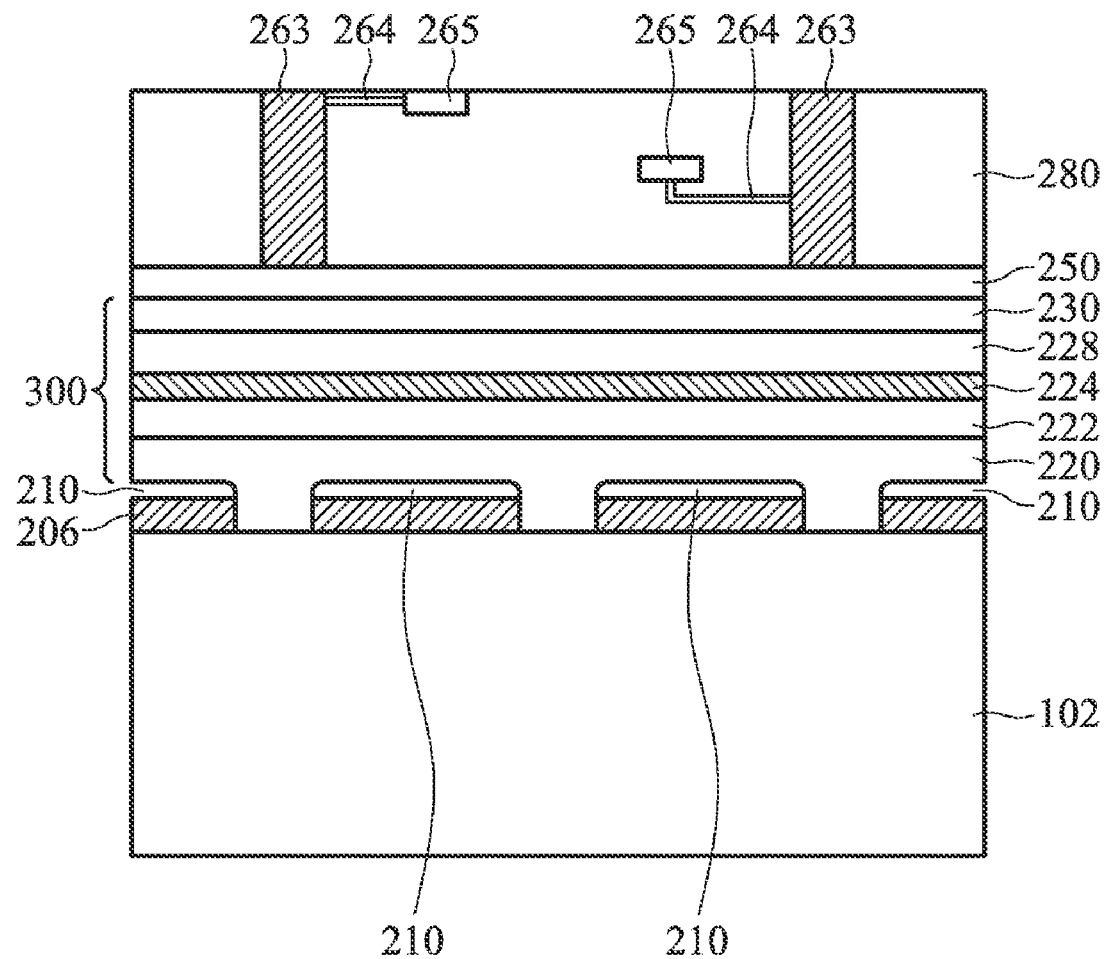

FIG. 5 illustrates forming a conductive substrate 280 on the LED structure 300 in accordance with an embodiment of the present invention. The conductive substrate 280 is formed over the LED structure 300 and the reflective layer 250, and provides an electrical contact to the conductive reflective layer 250 (and/or the second contact layer 230). The conductive substrate 280 may be formed of any suitable conductive material, such as doped silicon, metal, metal alloy, or the like. The conductive substrate 280 preferably has a thickness greater than about 50 μm.

In an embodiment, the conductive substrate 280 is formed by electroplating. In this embodiment, the wafer is coated with a metal, such as aluminum, nickel, chromium, copper, or the like, in a single or multiple layer structure.

In another embodiment, the conductive substrate 280 is formed of silicon. In this embodiment, a silicon substrate is bonded to the surface of the reflective layer 250, thereby forming the conductive substrate 280 as illustrated in FIG. 5. In an embodiment, the silicon substrate that is bonded is preferably a bulk silicon substrate doped with ions having a conductivity type the same as the second contact layer 230 of the LED structure 300. In another embodiment, the bonded substrate 280 is pre-processed with one or more through silicon vias (TSVs) 263, which may be coupled to one or more semiconductor devices 265 pre-formed in the same or different substrate through one or more metal trace 264. These semiconductor devices are electrically coupled to the LED structure 300 after the substrate 280 is bonded.

Figure 6:
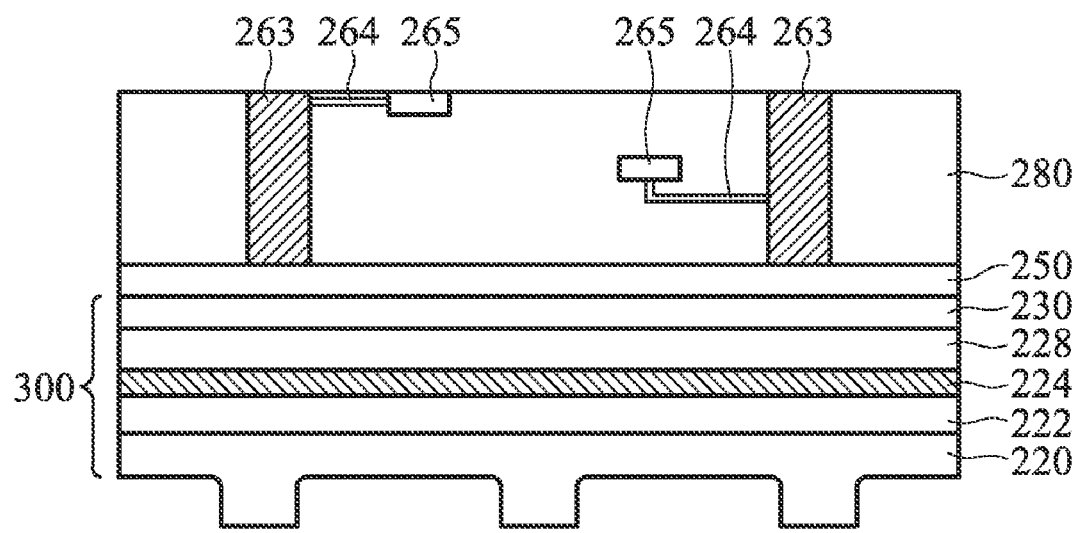

FIG. 6 illustrates removing the substrate 102 and the patterned mask 206 in accordance with an embodiment of the present invention. In one embodiment, the substrate 102 and the patterned mask 206 may be removed by wet chemical etch processes. In this embodiment, a phosphoric acid solution of about 120° C. to about 160° C. may be used to etch the silicon nitride patterned mask 206 from the silicon substrate 102 because the phosphoric acid has a high etch selectivity rate of silicon nitride mask 206 to the silicon substrate 102 (and other layers of the LED structure 300). After the removal of the patterned mask 206, the silicon substrate 102 may be removed by, for example, a wet dip in a solution of hydrofluoric acid, nitric acid, and acetic acid (commonly referred to as an HNA solution).

It is noted that, due to the existence of air bridges 210 between the LED structure 300 and the patterned mask layer 206 (FIG. 5), improved efficiency can be achieved in separating the LED structure from the growth substrate 102. Once the wafers are immersed in an etching solution, the liquid etchant may reach the entire substrate surface through air bridges 210, and the separating process can be significantly expedited. The separated substrate 102 may advantageously be reused, thereby reducing waste and reducing costs. The air bridges 210 also facilitates separating large area films from a large growth substrate, thus enhancing manufacturing throughput.

It is further noted that, after separating the LED structure 300 from the silicon substrate 102, the first contact layer 220 of the LED device has a textured face due to the protruding GaN features (FIG. 6) left after the removal of the patterned mask 206 and the growth substrate 102. These protruding features may have any suitable shapes depending upon the etch pattern on the patterned mask 206, such as squares, stripes, rectangles, circles, ovals, triangles, and/or the like. A textured light-emitting face on an LED device is typically a favorable feature that is formed to avoid light reflection at the light-emitting face.

Thereafter, processes may be performed to complete the LED device. For example, electrical contacts (front-side and/or back-side contacts) may be formed to the first and second contact layers, passivation layers may be formed, and the LED device may be diced and packaged.

While the above description assumes that the LED structure has a p-type surface facing the conductive substrate 280, one of ordinary skill in the art will appreciate that embodiments of the present invention may utilize an LED structure such that an n-type surface faces the conductive substrate. In these embodiments, the first contact layer 220 and the optional first cladding layer 222 would have a p-type conductivity, and the second cladding layer 228 and the second contact layer 230 would have an n-type conductivity.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a light-emitting diode(LED) device, the method comprising:
   providing a first substrate;
   forming and patterning a mask layer on a planar surface of the substrate, thereby creating a patterned mask layer;
   forming a first contact layer over the patterned mask layer with an air gap between the first contact layer and the patterned mask layer;
   forming an LED structure, wherein the first contact layer is a contact layer of the LED structure;
   forming a second substrate on the LED Structure, the second substrate being conductive; and
   separating the LED structure from the first substrate.

2. The method of claim 1, wherein the forming the first contact layer over the substrate comprises:
   forming seed regions in one or more openings in the patterned mask layer, the seed regions protruding from the patterned mask layer; and
   laterally growing lateral regions from the seed regions, the lateral regions extending over the patterned mask layer.

3. The method of claim 1, further comprising forming a light reflective layer on the LED structure.

4. The method of claim 1, wherein the forming the second substrate is performed at least in part by electroplating.

5. The method of claim 1, wherein the forming the conductive substrate is performed at least in part by forming a doped silicon layer over the LED structure.

6. The method of claim 1, wherein the separating the LED structure from the substrate is performed at least in part by a wet etch process.

7. The method of claim 1, wherein the second substrate on the LED structure further comprises semiconductor devices and through silicon vias (TSVs).

8. A method of forming a light-emitting diode(LED) device, the method comprising:
   providing a first substrate;
   forming and patterning a mask layer on a first side of the substrate, thereby creating a patterned mask layer, wherein the patterned mask layer is formed on a substantially flat surface;
   forming an LED structure over the patterned mask layer with an air bridge between the LED structure and the patterned mask layer;
   forming a second substrate over the LED structure on an opposing side of the LED structure from the first substrate; and
   detaching the first substrate from the LED structure through a wet etch process.

9. The method of claim 8, wherein the second substrate comprises one or more semiconductor devices and one or more through silicon vias (TSVs).

10. The method of claim 8, wherein the forming the LED structure comprises:
    forming seed regions in a plurality of openings in the patterned mask layer, the seed regions protruding from the patterned mask layer; and
    laterally growing lateral regions from the seed regions, the lateral regions extending over the patterned mask layer.

11. The method of claim 10, wherein the forming the seed regions and the laterally growing the first contact layer are performed by a selective metal organic chemical vapor deposition (MOCVD) process.

12. The method of claim 8, wherein the LED structure includes:
    a light emitting layer over the first contact layer;
    a second contact layer over the light emitting layer; and
    a reflective layer over the second contact layer, wherein the reflective layer is electrically conductive and provides electrical contact to the second contact layer.

13. The method of claim 8, wherein the second substrate over the LED structure is conductive.

14. The method of claim 13, wherein the forming the second substrate over the LED structure is performed at least in part by electroplating.

15. The method of claim 13, wherein the forming the second substrate is performed at least in part by bonding a doped silicon layer to the LED structure.

16. The method of claim 8, wherein the detaching the first substrate from the LED structure is performed at least in part by a first wet etching process removing the patterned mask layer followed by a second wet etching process separating the first substrate from the LED structure.

17. A method of forming a light-emitting diode(LED) device, the method comprising:
    forming and patterning a mask layer on a growth substrate, thereby creating a patterned mask layer;
    forming seed regions in one or more openings in the patterned mask layer, the seed regions protruding from the patterned mask layer;
    laterally growing from the seed regions until a continuous, first contact layer is formed over the patterned mask layer with an air ridge between the first contact layer and the patterned mask layer;

forming an LED structure wherein the first contact layer is a contact layer of the Led structure; and separating the LED structure from the growth substrate.

18. The method of claim 17, further comprising bonding a second substrate over the LED structure on an opposing side of the LED structure from the growth substrate.

19. The method of claim 18, wherein the second substrate on the LED structure is conductive.

20. The method of claim 18, wherein the second substrate comprises one or more semiconductor devices and one or more through silicon vias (TSVs), wherein the one or more semiconductor devices are electrically coupled to the LED structure through the one or more TSVs after the bonding.

21. The method of claim 17, wherein the separating the LED structure from the growth substrate is performed at least in part by a wet chemical etching process along the air bridge.

* * * * *